United States Patent [19]

Pienimaa

[11] Patent Number: 4,711,688
[45] Date of Patent: Dec. 8, 1987

[54] METHOD FOR ENCAPSULATING SEMICONDUCTOR COMPONENTS MOUNTED ON A CARRIER TAPE

[75] Inventor: Seppo Pienimaa, Virkkala, Finland

[73] Assignee: Oy Lohja AB, Virkkala, Finland

[21] Appl. No.: 708,785

[22] Filed: Mar. 6, 1985

[30] Foreign Application Priority Data

Mar. 9, 1984 [FI] Finland ................. 840981

[51] Int. Cl.⁴ .................. B29C 39/18; B29C 33/58
[52] U.S. Cl. .................. 156/244.12; 156/246; 156/344; 264/213; 264/272.13; 264/272.15; 264/272.17; 264/278; 264/316
[58] Field of Search ............ 29/740, 741, 841, 825, 29/588; 264/272.11, 272.13, 272.15, 272.17, 279.1, 278, 213, 313, 316, 271.1; 156/246, 244.12, 344, 261

[56] References Cited

U.S. PATENT DOCUMENTS

| | | |
|---|---|---|
| 2,969,300 | 1/1961 | Franz ................. 156/261 |
| 3,754,070 | 8/1970 | Dunn et al. ........... 29/588 |
| 4,069,931 | 1/1978 | Saylors ............... 156/344 |
| 4,079,509 | 3/1978 | Jackson et al. ........ 29/740 |
| 4,238,528 | 12/1980 | Angelo et al. ........ 29/841 |
| 4,374,080 | 2/1983 | Schroeder ........... 264/272.11 |

FOREIGN PATENT DOCUMENTS 7705777 5/1977 Sweden .
2009504 6/1979 United Kingdom .

Primary Examiner—Donald E. Czaja
Assistant Examiner—J. Davis
Attorney, Agent, or Firm—Fitzpatrick, Cella, Harper & Scinto

[57] ABSTRACT

In the present publication a method is described for encapsulating of components (3), in particular of semiconductor components, mounted on a carrier tape (6) by means of a polymer in order to prevent access of moisture into the component (3). According to the invention a polymer film (24, 25) is pressed onto the support area (2) of each component (3) from both sides of the carrier tape (6), and the carrier tape (6) treated in this way is subjected to warm-air blasting (14). Thereupon, an encapsulating tape (9) that has been moistened with polymer (13) and subjected to a warm-air treatment (15) is connected to one side of the carrier tape (6), and the combination tape (6, 9) in this way obtained is heated in a pre-heating oven (16). Hereupon, encapsulating polymer (26) is spread by means of a dispensing and spreading device (17, 18), onto the face of the component (3) and then onto its ILB area (19), and the combination tape (6, 9) in this way treated is heated in an oven zone (20) in order to harden the polymer. Finally, the encapsulating tape (9) is detached from the carrier tape (6) now containing the encapsulated components (3).

6 Claims, 7 Drawing Figures

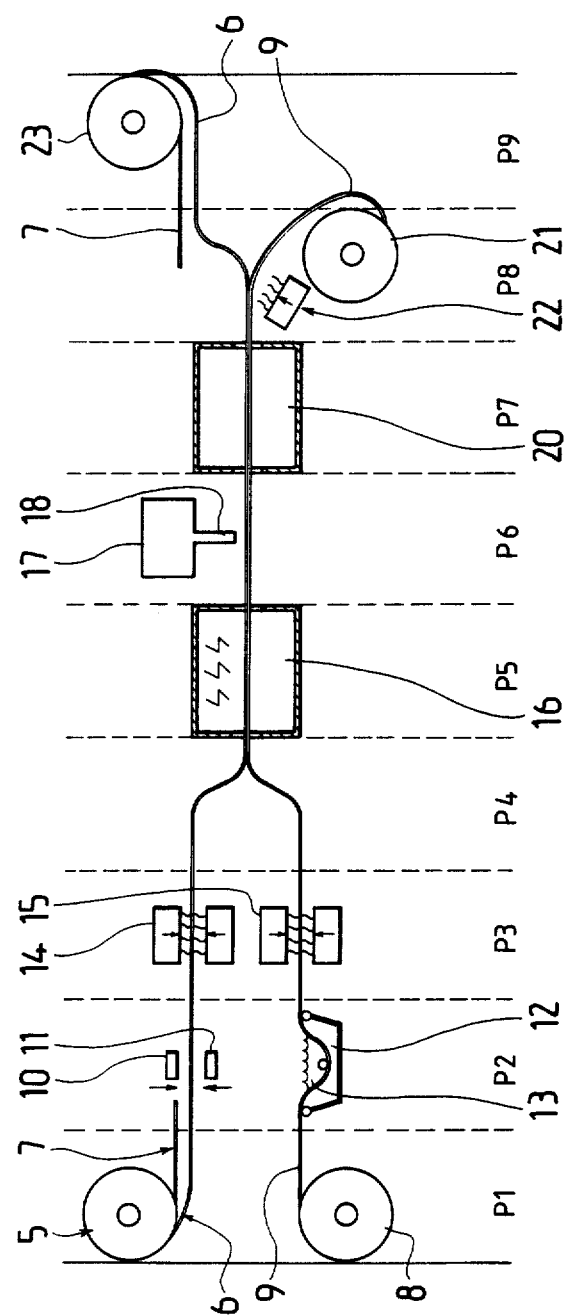

METHOD FOR ENCAPSULATING SEMICONDUCTOR COMPONENTS MOUNTED ON A CARRIER TAPE

The present invention concerns a method in accordance with the preamble of claim 1 for encapsulating semiconductor components mounted on a carrier tape.

Owing to an increased packaging density in electronics, owing to defects noticed in wire-bonded components encapsulated by means of a polymer, and owing to the requirements on automation, a carrier-tape technique known per se (Tape Automated Bonding) has been developed. Normally, in the methods for automatic setting and handling of components, unprotected semiconductor components mounted on a carrier tape are used. The unprotected components are subject to environmental effects and mechanical damage in connection with the handling of the components or of the products including components. This is why it is necessary to encapsulate the semiconductor components on the tape so that the tape and the components can be used in automatic machines, just like unencapsulated components can.

In the methods of protection of carrier-tape components known in prior art, only the face of the semiconductor piece is protected, as disclosed, e.g., in the publication No. GB A 2,009,504 (H 01 L 21/94), or the semiconductor piece and the conductors extending from same are protected, so that the component is difficult to handle in automatic setting machines.

It is an object of the present invention to provide a more practical method for the encapsulation of components mounted on a tape.

The invention is based on the idea that each component and the conductors extending from the component are protected by means of the encapsulation polymer up to a desired distance from the component. In the method, the polymer is spread by means of a dispenser device onto the semiconductor component. The spreading of the encapsulation polymer beyond the desired area is prevented by using agents that reduce the surface energy, and an encapsulation tape.

In the method in accordance with the present invention, the spreading of the encapsulating polymer is limited in a controlled way. The components encapsulated in accordance with the method are easy to handle, because the encapsulating polymer does not contaminate the support area functioning as an aligning and handling plane while, however, protecting the conductors extending from it towards the component, which is a great advantage owing to the protection from moisture offered thereby, in particular in the case of high-voltage components. Components encapsulated by means of this method can be used in the same way as surface connection components after the connecting conductors of the component have been bent.

The use of a fluoropolymer of low surface energy in order to limit the spreading of the encapsulating polymer is known per se, e.g., from the publication No. SE B 11 401,056 (H 01 L 21/56), wherein it is used in the drop protection of a semiconductor wire-connected onto a substrate. In the present invention, the large moistening angle due to the low surface energy, and a suitable encapsulating tape have been applied for the preparation of an encapsulation of specified shape and dimension for carrier-tape components before their connection to the component plate.

More specifically, the method in accordance with the invention is characterized by what is stated in the characterizing part of claim 1.

By means of the method in accordance with the invention, it is possible to prevent access of moisture into the component in a highly efficient manner.

The invention will be examined in the following in more detail by means of the exemplifying embodiment in accordance with the attached drawings.

FIG. 5 shows one embodiment of the method in accordance with the invention as an operating diagram.

Figure 1A:
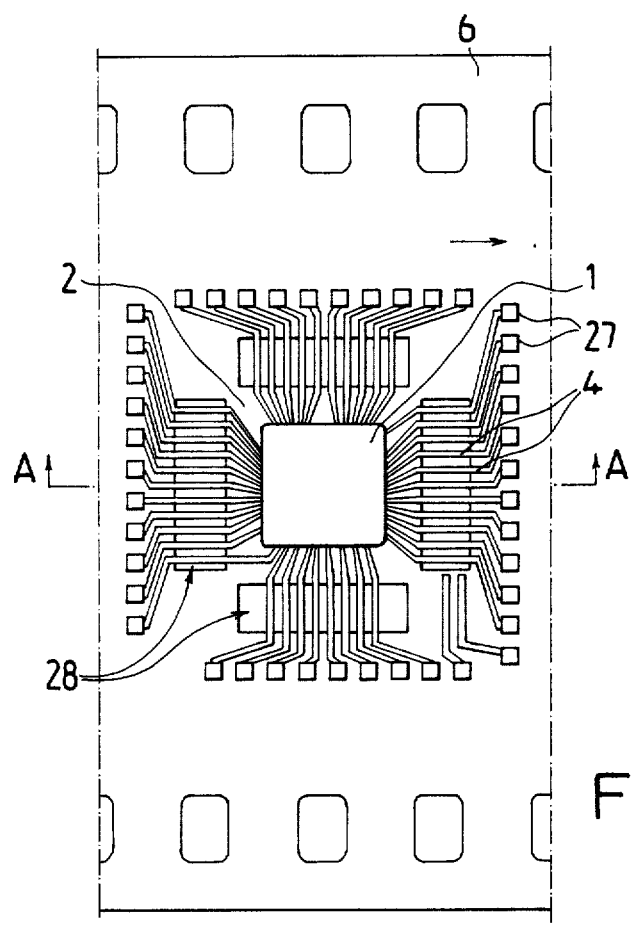
FIG. 1a shows an encapsulated component as viewed from above.
Figure 1B:
FIG. 1b is sectional view of the component of FIG. 1a, taken along the line A—A.

By means of the encapsulating polymer coating 1, the area 19 inside the annular support area 2 of the carrier tape 6 (the so-called ILB area) is protected. This area 2 comprises the TAB (Tape Automatic Bonding) component 3 and its connecting conductors. The encapsulating method comprises nine steps P1 to P9 (FIG. 5) as follows:

STEP 1

Into the encapsulating apparatus, a TAB or carrier tape reel 5 is inserted, the carrier tape 6 is taken off the reel, and the carrier tape 6 is fed forwards, and the spacer tape 7 is removed. The carrier tape 6 may be made of, e.g., a polyimide, a polyester, or glass fibre epoxy. The other reel 8 in the apparatus is provided for the encapsulating tape 9. The function of the encapsulating tape 9 is to prevent spreading of the polymer to underneath the component 3 and the annular support area 2. The encapsulating tape 9 moves forwards simultaneously with the carrier tape 6.

STEP 2

Figure 2:
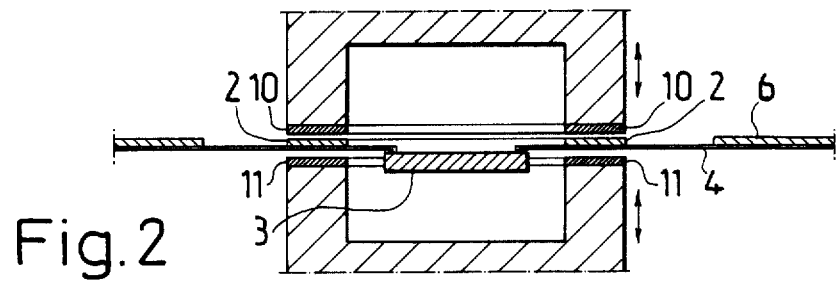
FIG. 2 is a sectional view of an apparatus for the application of the polymer film limiting the spreading of the encapsulation polymer.

The surface energies of the support area 2 of the carrier tape 6 and of the encapsulating tape 9 must be sufficiently low in order that the encapsulating polymer, 26 should not moisten them. This prevents spreading of the encapsulating polymer 26 to underneath and onto the support area 2. The support area 2 is "stamped" from above and from underneath by means of stamps 10, 11, whose cross-sectional shape is similar to the shape of the annular support area 2 (FIG. 2). By means of the stamps 10, 11, a polymer film of low surface energy 24, 25 is pressed on both sides of the support area 2 (FIG. 2). The polymer of low surface energy to be absorbed onto the stamps 10, 11 has been dissolved into a readily volatile solvent. The encapsulating tape 9 is guided through a basin 12 containing said solution 13 of the low surface energy polymer and solvent, whereby the tape 9 becomes coated with the polymer. Alternatively, it is possible to use a tape whose surface energy is sufficiently low, in which case the tape need not be coated.

STEP 3

The carrier tape 6 and the encapsulating tape 9 pass through a warm-air blast 14, 15. In the warm-air blast 14, 15 the solvent of the polymer used in the preceding step is evaporated. The blast 14, 15 also removes any loose particles possibly present on the semiconductor component 3.

STEP 4

Figure 3A:
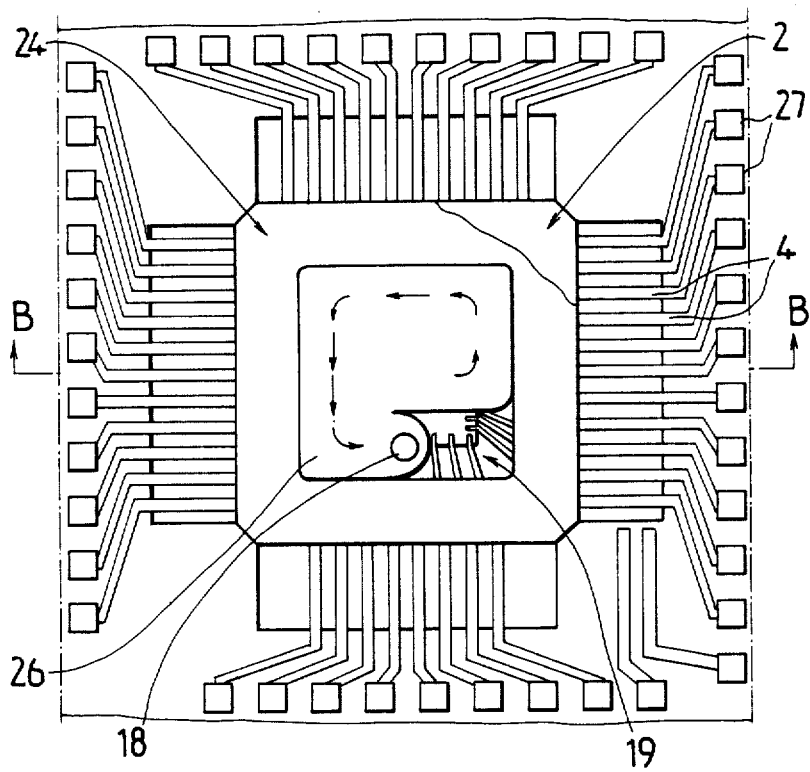
FIG. 3a shows a component being encapsulated, as viewed from above.
Figure 3B:
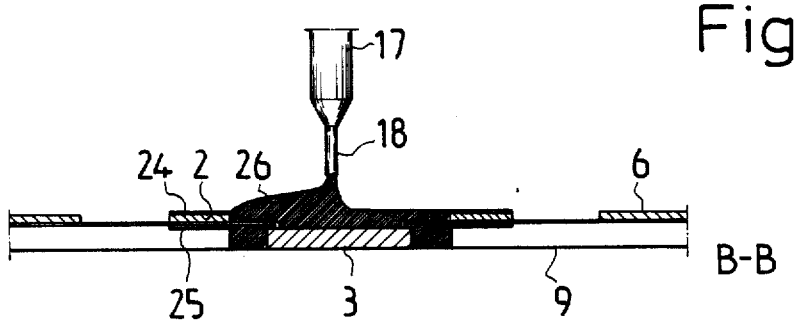
FIG. 3b is a sectional view of the component of FIG. 3a, taken along the line B—B.
Figure 4:
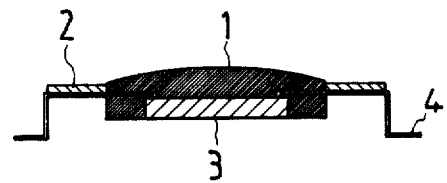
FIG. 4 is a sectional view of a final component.

The encapsulating tape 9 is guided to underneath the carrier tape 6 so that it is pressed evenly against the bottom of the semiconductor piece 3. From this step up to step 8, the encapsulating tape 9 is tightly fixed on the bottom of the semiconductor piece 3. The encapsulating tape 9 prevents flow of encapsulating polymer 26 to a level lower than the bottom face level of the semiconductor piece 3 (FIG. 3b).

STEP 5

The encapsulating tape 9 and the carrier tape 6 above it are heated in the first oven zone 16. The encapsulating polymer 26 moistens the face of the component 3 better when it is warm.

STEP 6

The encapsulating polymer 26, e.g., epoxy, polyurethane, or silicon, is spread first onto the face of the semiconductor piece 3, thereupon onto the ILB area 19. The dosage of the polymer 26 is carried out by means of a dispenser 17, and the spreading by shifting the dispensing tip 18 relative the area to be protected. Some encapsulating materials require preheating in order that they should spread evenly onto the face to be protected. The viscosity of the encapsulating polymer is reduced and its moistening capacity increased if the dispensing tip 18 or the polymer container (not shown) is heated.

STEP 7

The encapsulating polymer 26 is hardened in the second oven zone 20.

STEP 8

The encapsulating tape 9 is removed from underneath the encapsulated TAB components mounted on the carrier tape 6 onto the reel 21. At this stage, if necessary, a hot-air blast 22 is used to heat the encapsulating tape 9. On heating, the tape 9 becomes softer, whereby it becomes detached more readily from the encapsulating TAB components 3.

STEP 9

The carrier tape 6, provided with the encapsulating TAB components 3, and the spacer tape 7 are passed onto the reel 23 one above the other.

What is claimed is:

1. A method for encapsulating electronic components with an encapsulating polymer, wherein the components have conductors mounted on a carrier tape having an annular support area for each component, characterized by the steps of pressing a mixture of a solvent and of a polymer of low surface energy onto the support area for each component from both sides of the carrier tape, wherein the mixture prevents spreading of the encapsulating polymer, subjecting the carrier tape bearing the solvent and polymer mixture to a warm-air blast, during which the solvent evaporates such that polymer films of low surface energy remain on both sides of the support area, guiding an encapsulating tape which has been moistened with a polymer of low surface energy and dried by means of warm-air treatment to the bottom of the components mounted on the carrier tape, pressing the encapsulating tape evenly against the bottom of the components, heating the combined assembly of carrier and encapsulating tapes in a first heating zone, spreading encapsulating polymer onto the face of the component and onto an area between the support area and the component by means of a dispensing and spreading device, heating the combined assembly of tapes including the encapsulating polymer in a second heating zone in order to harden the polymer encapsulation, and detaching the encapsulating tape from the carrier tape, now containing the encapsulated components, so as to leave the bottom of the components unprotected.

2. Method as claimed in claim 1, characterized in that hot-air blasting (22) is used for detaching the encapsulating tape (9).

3. A method as claimed in claim 1 characterized in that the pressing of the polymer films onto the support area of each component is carried out by means of stamps shaped equal to the support area and by pressing the support area from both sides.

4. A method as claimed in claim 1, characterized in that the encapsulating tape is moistened by passing it through a basin containing the polymer of low surface energy prior to pressing the encapsulating tape against the components.

5. A method as claimed in claim 1, characterized in that the polymer films are pressed onto the support areas by means of a stamp of desired shape.

6. A method as claimed in claim 1, characterized in that the solvent is an organic solvent.

* * * * *

UNITED STATES PATENT AND TRADEMARK OFFICE
CERTIFICATE OF CORRECTION

PATENT NO. : 4,711,688

DATED : December 8, 1987

INVENTOR(S) : SEPPO PIENIMAA

It is certified that error appears in the above-identified patent and that said Letters Patent is hereby corrected as shown below:

COLUMN 2

Line 51, "mer, 26".should read --mer 26--.

COLUMN 3

Line 32, "relative the" should read --relative to the--.

COLUMN 4

Line 37, "Method" should read --A method--.
Line 38, "(2)" should be deleted.
Line 39, "(9)" should be deleted.
Line 40, "claim 1" should read --claim 1,--.

Signed and Sealed this

Seventh Day of June, 1988

Attest:

DONALD J. QUIGG

Attesting Officer

Commissioner of Patents and Trademarks